United States Patent
Chin et al.

(10) Patent No.: US 7,940,068 B2
(45) Date of Patent: May 10, 2011

(54) TEST BOARD

(75) Inventors: Chih-Jen Chin, Taipei (TW);
Chun-Hao Chu, Taipei (TW);
Ting-Hong Wang, Taipei (TW);
Sheng-Yuan Tsai, Taipei (TW)

(73) Assignee: Inventec Corporation, Taipei (TW)

( * ) Notice: Subject to any disclaimer, the term of this patent is extended or adjusted under 35 U.S.C. 154(b) by 168 days.

(21) Appl. No.: 12/505,545

(22) Filed: Jul. 20, 2009

(65) Prior Publication Data

US 2010/0301886 A1 Dec. 2, 2010

(30) Foreign Application Priority Data

Jun. 1, 2009 (TW) .............................. 98118016 A

(51) Int. Cl.
*G01R 31/20* (2006.01)
(52) U.S. Cl. ................................................. 324/754.08
(58) Field of Classification Search ............ 324/754.08, 324/750.3
See application file for complete search history.

(56) References Cited

U.S. PATENT DOCUMENTS 6,429,724 B1 * 8/2002 Ogura et al. .................. 327/536
7,091,770 B2 * 8/2006 Schlaffer ...................... 327/541
* cited by examiner Primary Examiner — Ha Tran T Nguyen
Assistant Examiner — Tung X Nguyen
(74) Attorney, Agent, or Firm — CKC & Partners Co., Ltd.

(57) ABSTRACT

A test board is provided. The test board includes a power connecting interface, diode modules, a power module a detecting module, and a processor. The power connecting interface includes power pins, wherein each of the power pins is electrically connected to a motherboard power socket to receive a power signal. Each of the diode modules is electrically connected to one of the power pins and includes at least one diode. The power module is electrically connected to the diode modules to receive the power signal through each of the diode modules. The detection module is electrically connected to points between the diode modules and the power connecting interface to generate a detection result according to the voltage between each diode module and the power connecting interface. The processor is used to determine the connecting state between the power pin and the corresponding motherboard power socket according to the detection result.

6 Claims, 2 Drawing Sheets

US 7,940,068 B2

TEST BOARD

RELATED APPLICATIONS

This application claims priority to Taiwan Application Serial Number 98118016, filed Jun. 1, 2009, which is herein incorporated by reference.

FIELD OF THE INVENTION

This invention relates to a test boards and more particularly, to a test board including a plurality of diode modules.

BACKGROUND OF THE INVENTION

In the process of making a motherboard, to prevent the motherboard from having problems after being delivered to a customer, a plurality of pretests have to be conducted on the components of the motherboard in advance to check if the components function normally. If the motherboard cannot function normally after being delivered to a customer, the manufacturer of the motherboard may suffer a great financial loss. Therefore, the pretests of the components, such as the pretests of slots (such as a PCI slot), are very important. The slot of the motherboard includes a plurality of power sockets electrically connected in parallel. In a conventional testing technology, due to the parallel connection of the power sockets, it is very hard to determine if one of the power sockets has a defect resulting in a power disconnection between the power socket and an interface card electrically connected thereto, except that all of the power sockets have the defect. When one of the power sockets has the defect, the power socket having the defect does not affect the voltage provided by all of the power sockets. However, shortage of the amount of the power sockets having no defect may decrease the power provided by the power sockets, thereby affecting the function of the interface card.

Therefore, how to design a new test board, which can check if one of the power sockets of the slot has the defect, is a very important problem to be solved.

SUMMARY OF THE INVENTION

An aspect of the present invention is to provide a test board including a power connecting interface, a plurality of diode modules, a power module, a detecting module, and a processor. The power connecting interface includes a plurality of power pins, wherein each of the power pins is electrically connected to a motherboard power socket to receive a power signal. Each of the diode modules is electrically connected to one of the power pins and includes at least one diode. The power module is electrically connected to the diode modules to receive the power signal through each of the diode modules. The detection module is electrically connected to a plurality of points between the diode modules and the power connecting interface to generate a detection result according to the voltage between each diode module and the power connecting interface. The processor is used to determine the connecting state between the power pin and the corresponding motherboard power socket according to the detection result.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
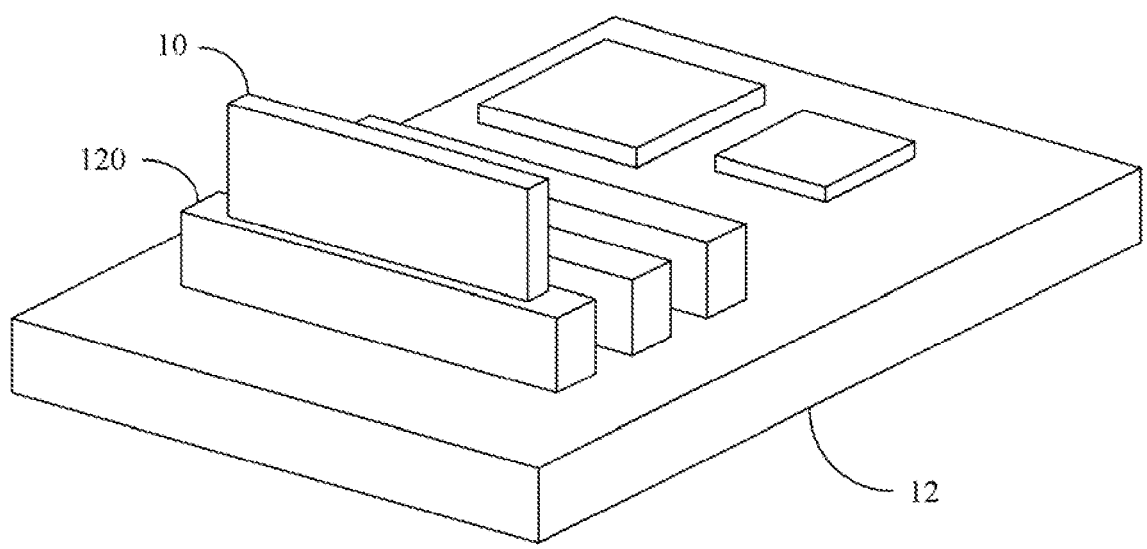
FIG. 1 is a pictorial diagram showing the connection between a test board and a motherboard according to an embodiment of the present invention.
Figure 2:
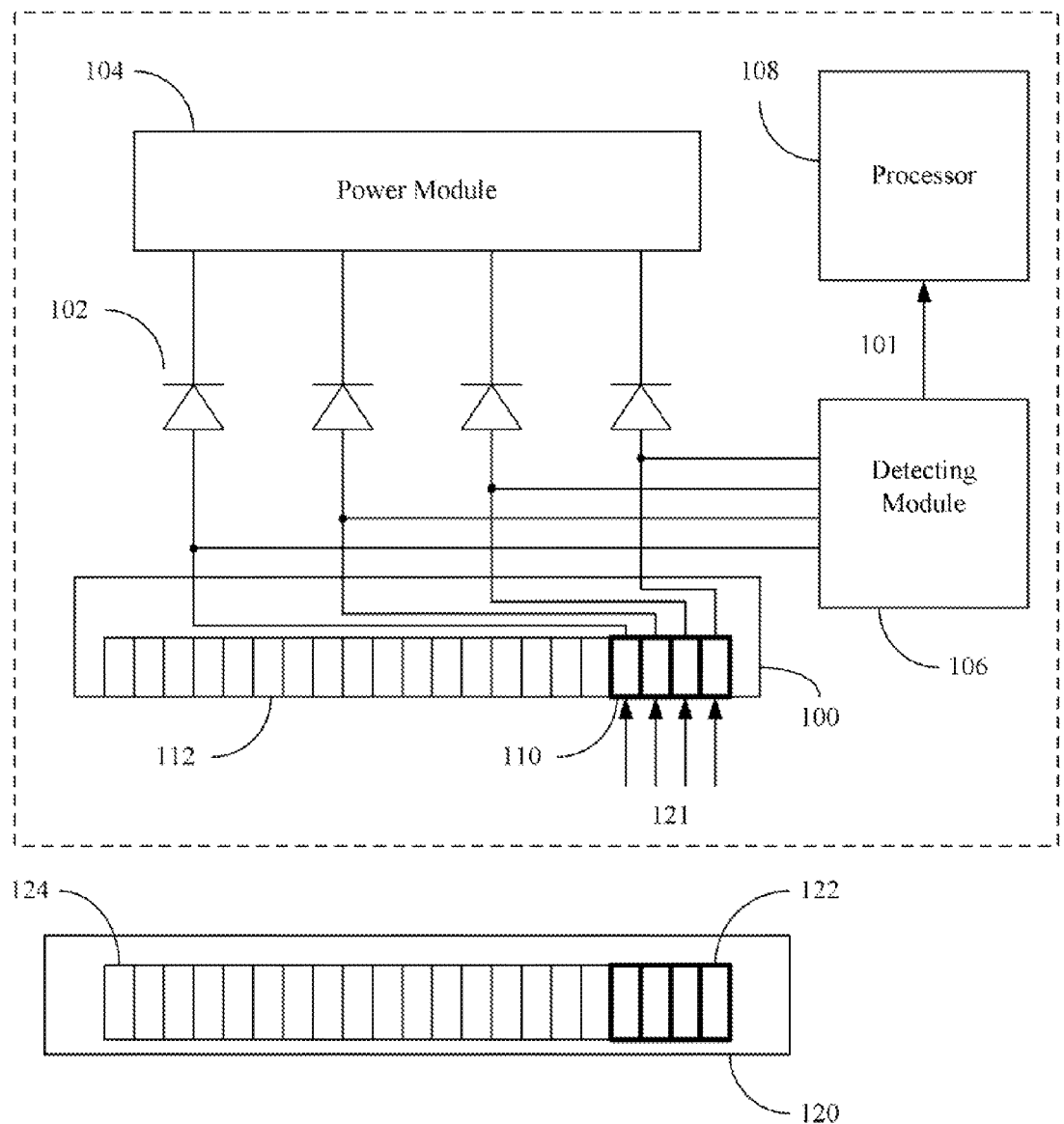
FIG. 2 is a diagram showing the test board 10 and the slot of the motherboard in the FIG. 1.

Referring to FIG. 1. FIG. 1 is a pictorial diagram showing the connection between a test board 10 and a motherboard 12 according to an embodiment of the present invention. The motherboard 12 includes a plurality of slots 120, and the test board 10 can be electrically connected to one of the slots 120. Further referring to FIG. 2. FIG. 2 is a diagram showing the test board 10 and the slot 120 of the motherboard 12 in the FIG. 1. The slot 120 includes a plurality of motherboard power sockets 122. The slot 120 substantially further includes sockets 124 used to transmit data, and thus the slot 120 can provide electrical power and transmit data to an interface card respectively via the motherboard power sockets 122 and the sockets 124 when the slot 120 holds the interface card. The test board 10 includes a power connecting interface 100, four diode modules 102, a power module 104, a detecting module 106, and a processor 108. The power connecting interface 100 includes power pins 110 used to be electrically connected to the motherboard power sockets 122 to respectively receive a power signal 121. In this embodiment, the voltage level of the power signal 121 is 12 volts, but in other embodiments of the present invention, the voltage level of the power signal 121 can be changed according to the demands of the embodiments. The power connecting interface 100 substantially further includes other connecting pins 112 to test sockets 124 of the slot 120. However, merely the things about the power connecting pins 110 are described in the present invention.

Each of the four diode modules 102 includes a diode, and the four diode modules 102 are electrically connected to the power pins 110 in a one to one manner. It is noted that in other embodiments, the diode module 102 can include at least two diodes connected in parallel, therefore the amount of the diodes of the diode module 102 is not limited by this embodiment. The power module 104 is electrically connected to the diode modules 102 to receive the power signal 121 through each of the diode modules 102. The detecting module 106 is electrically connected to points between the diode modules 102 and the power connecting interface 100 to detect the voltage levels of the points and perform a voltage-reducing step to generate a detection result 101 according to the voltage levels of the points. In this embodiment, the detecting module 106 is an analog switch. The analog switch is turned on or off in accordance with the voltage level of the points to generate the detection result 101. The processor 108 is use to determine the connecting state between the power pin 110 and the corresponding motherboard power socket 122 according to the detection result.

When the motherboard power socket 122 having a defect resulting in a power disconnection between the motherboard power socket 122 having the defect and the power pin 110 corresponding thereto, the corresponding power pin 110 cannot output the power signal 121 to the diode modules 102 and the power module 104. However, after receiving the power signal 121 transmitted by each of the power pins, the power module 104 sends the power signal 121 back to each of the power pins. Then, the diode module 102, in correspondence with the power pin 110 corresponding to the motherboard power socket 122 having the defect, stops the power signal 121 from being sent back to the power pin 110 corresponding to the motherboard power socket 122 having the defect, thereby keeping the voltage level of a point between the power pin 110 corresponding to the motherboard power socket 122 having the defect and the corresponding power module 104 in a value of 0 volt. For the pins not having the defect, the voltage level of a point between each of the pins not having the defect and the corresponding power module 104 is in a value of 12 volts. Therefore, the detecting module 106 can generate the detection result 101 according to the voltage levels of the points between the diode modules 102 and the power pins 110 to enable the processor 108 to determine if the power pins have good electrical connection with the motherboard power sockets 122.

It is noted that in other embodiments, the amount of the diode modules, the power pins and the motherboard power sockets can be changed according to the demands of the embodiments, and not limited by the aforementioned embodiment.

The advantage of the present invention is to use the diode modules to prevent the power module from sending back the power signal to the power sockets when the power sockets are connected in parallel, and thus the power socket having the defect can be determined by using the detection module to detect the voltage level of the power pin connected to the power socket having the defect.

As is understood by a person skilled in the art, the foregoing embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A test board, comprising:
   a power connecting interface comprising a plurality of power pins, wherein each of the power pins is electrically connected to a motherboard power socket to receive a power signal;
   a plurality of diode modules, wherein each of the diode modules is electrically connected to one of the power pins and comprises at least one diode;
   a power module electrically connected to the diode modules to receive the power signal through each of the diode modules;
   a detection module electrically connected to a plurality of points between the diode modules and the power connecting interface to generate a detection result according to the voltage between each diode module and the power connecting interface; and
   a processor used to determine the connecting state between the power pin and the corresponding motherboard power socket according to the detection result.

2. The test board of claim 1, wherein the detection module reduces the voltage level of a point between each the diode module and the power connection interface to generate the detection result.

3. The test board of claim 1, wherein the voltage level of the power signal is 12 volts.

4. The test board of claim 1, wherein the detection module is an analog switch, and the analog switch is turned on or off in accordance with the voltage level of the points to generate the detection result.

5. The test board of claim 1, wherein when one of the power pins has a defect resulting a bad electrical connection with the motherboard power socket corresponding to the one of the power pins, the diode module corresponding to the one of the power pins stops the power signal from being sent back to the one of the power pins.

6. The test board of claim 5 wherein the voltage level of a point between the power connecting interface and the diode module corresponding to the one of the power pins is 0 volt, and thus the processor determines that the electrical connection between the one of the power pins and the corresponding motherboard power socket is bad according to the detection result.

\* \* \* \* \*